United States Patent [19]
Pryor

[11] 3,944,936
[45] Mar. 16, 1976

[54] ZERO CROSSOVER DETECTOR

[75] Inventor: Richard Lee Pryor, Voorhees, N.J.

[73] Assignee: RCA Corporation, New York, N.Y.

[22] Filed: Aug. 7, 1974

[21] Appl. No.: 495,425

[52] U.S. Cl. ............... 328/150; 328/165; 328/127; 307/235 E
[51] Int. Cl.² ........................................ H03K 17/16
[58] Field of Search ........... 328/127, 150, 165, 151; 307/235

[56] References Cited
UNITED STATES PATENTS

| | | | |
|---|---|---|---|
| 3,231,823 | 1/1966 | Garfield et al. | 328/127 |
| 3,505,537 | 4/1970 | Giordano | 307/235 |
| 3,639,779 | 2/1972 | Garrigus | 307/235 |
| 3,659,208 | 4/1972 | Fussell | 328/151 |
| 3,760,282 | 9/1973 | Arnold et al. | 328/150 X |
| 3,767,938 | 10/1973 | Kueper | 307/235 |
| 3,842,291 | 10/1974 | Maringer | 328/165 X |

*Primary Examiner*—John S. Heyman
*Attorney, Agent, or Firm*—Harold Christoffersen; Samuel Cohen; Kenneth Watov

[57] ABSTRACT

The bipolar signals produced, for example, by a magnetic transducer which senses the positions of slots in a ferromagnetic damper wheel, are integrated. The resulting integrated signal has peaks at times corresponding to the zero crossings of the bipolar signals and is of lower, relatively constant, amplitude at other times. The peaks may be used to prime an otherwise disabled circuit in the path through which signals indicative of zero crossings are transmitted to thereby discriminate between zero crossings of interest (those of the bipolar signals) and those due to noise.

11 Claims, 2 Drawing Figures

ZERO CROSSOVER DETECTOR

The present invention relates to signal detectors, such as those suitable for detecting a signal indicative of the position of a moving part, for example, the damper wheel of an engine. Such signals can be employed as timing pulses for control purposes.

Certain proposed antipollution control systems for automotive engines include computerized electronic ignitions, to provide control of a plurality of engine functions. Such computerized systems require very accurate timing data relating to the occurrence of the top dead center or other reference position of one or more pistons within their respective cylinders of the engine.

A transducer, such as a magnetic transducer, may be used to provide unprocessed signals indicative of the position of the damper wheel of the engine and this positional information can be translated to cylinder position information. The transducer is placed in close proximity to the damper wheel, and magnetic anomalies, such as slots, ferromagnetic slugs, magnets or the like are placed on this wheel. The signal produced by the magnetic transducer when it detects a magnetic assembly is a bipolar signal. Its amplitude is directly proportional to the angular speed of the damper wheel and its width is inversely proportional to the angular speed of the damper wheel. At the lowest engine speeds, the bipolar sense signal may have a 100 MV peak-to-peak amplitude, and a peak-to-peak time duration or width of 4 milliseconds. At the highest engine speeds, the bipolar sense signal may have an amplitude of 30 volts peak-to-peak, and a peak-to-peak time duration of 20 microseconds.

The transducer also picks up noise from the portions of the damper wheel between the slots, due to surface irregularities on the ferromagnetic damper wheel (generally most automotive engines use damper wheels made from ferromagnetic material). The noise is coherent with the bipolar signal, and therefore has the same amplitude and time duration proportionality to the angular speed of the damper wheel, as the signal, at low engine speeds, the noise is less than 10 millivolts, whereas at high engine speeds the noise may reach 2.1 volts peak-to-peak in amplitude, which is more than 20 times the 100 millivolt peak-to-peak amplitude of the bipolar sense signal at the low engine speed.

The zero crossing of the bipolar sense signal, which is midway between the times of occurrence of the positive and negative peaks of the sense signal, is indicative of the center of a slot whose position is being sensed. Thus, this zero crossing can be employed as a true timing mark. However, it is a requirement of at least one computerized ignition system that the timing pulses supplied to the computer be of constant width and amplitude, regardless of engine speed. One problem dealt with in the present application is that of processing the position signals which are sensed, in the presence of noise, to obtain such constant amplitude and constant width timing pulses which still accurately represent position.

The present invention resides in part, in the discovery that if a signal of the type discussed above is integrated, the integrated signal will have peaks at points corresponding to zero crossings of interest and be of relatively low, relatively constant amplitude at other time. The peaks are employed to discriminate between zero crossing signals of interest and those due, for example, to noise.

The invention is illustrated in the drawing of which:

Figure 1:
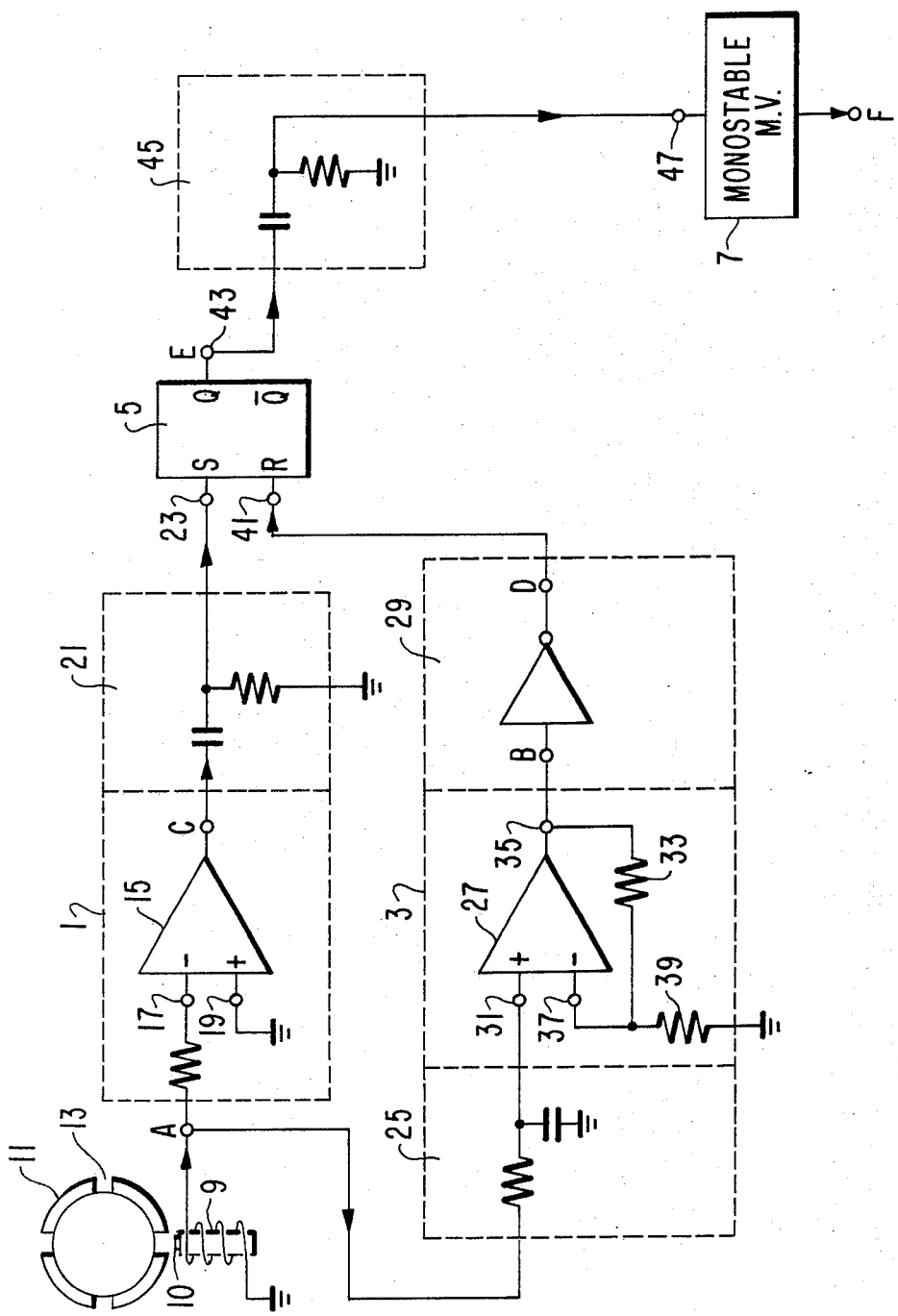
FIG. 1 is a schematic diagram of an embodiment of the invention.

The noise insensitive positional signal detector shown in FIG. 1 includes a voltage comparator network 1; an integrating channel 3; a flip-flop 5 and a one-shot or monostable multivibrator 7. A magnetic transducer 9 fixed to the chassis is used to sense predetermined positions around the circumference of a rotatable element, such as the ferromagnetic damper wheel 11 or the flywheel, or some other rotatable element driven by a combustion engine, the predetermined positions being in the form of slots 13 machined into the circumference of the wheel 11. The detector can be built in integrated circuit form.

The voltage comparator network 1 includes an RC differentiator network 21 and a voltage comparator 15 comprising an operational amplifier. The inverting input terminal 17 of this amplifier is resistively coupled to the output terminal A of the transducer 9 and its non-inverting input terminal 19 is connected to a point of reference potential-ground. The RC differentiator network 21 is connected between the output terminal C of the voltage comparator 15 and the set input terminal 23 of the flip-flop 5.

The integration channel 3 includes a passive RC integrating network 25, a non-inverting operational amplifier 27, and an inverting threshold detector 29. The RC-passive integrator is connected between the output terminal A of the transducer 9 and the non-inverting input terminal 31 of amplifier 27. The gain of the non-inverting amplifier 27 is determined by a feedback resistor 33 connected between the output terminal 35 and inverting input terminal 37 of the amplifier 27, and a resistor 39 connected between the inverting input terminal 37 of the amplifier 27 and a reference voltage point. The inverting threshold detector 29 has an input terminal B connected to the output terminal 35 of the amplifier 27, and an output terminal D connected to the reset terminal 41 of flip-flop 5. The threshold setting (a bias control) is internal to detector 29. An RC-differentiator network 45 is connected between the Q output terminal 43 of the flip-flop 5 and the input terminal 47 of the monostable multivibrator 7. The one-shot or monostable multivibrator 7 has an output terminal F.

Figure 2:
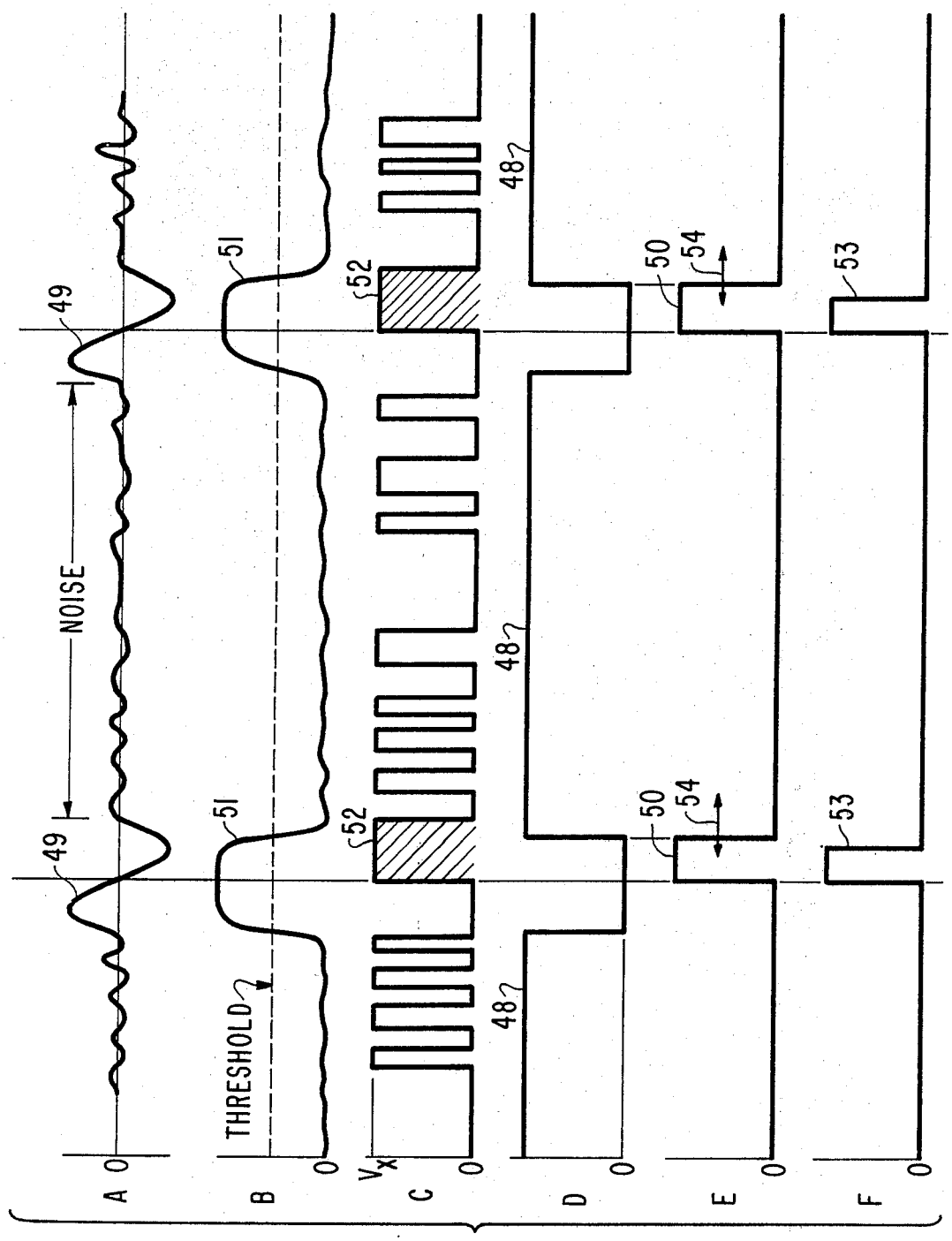
FIG. 2 is a drawing of waveforms present in the circuit of FIG. 1.

In the discussion which follows of the operation of the noise insensitive positional signal detector, both FIGS. 1 and 2 should be referred to. As shown, waveform A is the output signal of the transducer 9, and contains bipolar positional signals 49 indicative of the positions of slot 13 of the fly wheel 11. Noise voltages are also contained in the output waveform A of the transducer 9, between the occurrences of the bipolar positional signals 49.

The output signals of the transducer 9 are processed by the voltage comparator 15 to produce the pulsed waveform C at output terminal C of comparator 15. This comparator is a high gain operational amplifier and it compares the signal it receives at its inverting terminal 17 with the voltage (ground level) at its non-inverting terminal 19. Whenever the signal A is more positive than ground, then the output signal at C is clamped to the voltage at terminal 19 — ground level.

Whenever the signal at A is more negative than ground level, the signal at C goes positive to a second level shown as $V_x$ in FIG. 2. The transitions between these two levels is very abrupt.

The signal C is shown at C in FIG. 2. Note that both noise and signal at A, when negative, cause C to go positive to the level $V_x$. The cross hatched pulses 52 of waveform C are indicative of the negative peaks of the bipolar signals 49 and the leading edges of pulses 52 occur at the zero crossovers.

The output waveform C of voltage comparator 15 is differentiated by differentiator network 21 to provide set signals for flip-flop 5. In more detail, each time a positive-going-edge occurs in the wave C, the differentiator produces a positive pulse and this positive pulse tends to set the flip-flop 5. However, as will be explained shortly, a reset level is applied to the reset terminal of flip-flop 5 for all periods except the relatively small intervals during which the bipolar signal 49 is present. The flipflop has the characteristic that a reset level overrides a concurrent set input level so that this reset level prevents the flip-flop from being set, except by the positive going edges of wave C which occurs during these relatively small intervals.

The waveform A also is applied to the passive integrator 25 of channel 3 and the integrated wave thereby obtained is amplified by amplifier 27 to provide waveform B. This wave B is applied to the threshold detector and inverter 29. As may be observed at 51, it has been found that there is a positive monopolar pulse in wave B whose amplitude is constant over the entire speed range of the engine and the center region of the peak of this pulse always occurs at, that is, is concurrent with, the zero crossover of the bipolar signal 49. Moreover, it has also been found that the integrated noise level is relatively constant and lower than a given amplitude level. The threshold level of the threshold detector 29 is set above the integrated noise level but below the peak amplitude level of the integrated and amplified output signal B, as shown by dashed line legended "threshold" in FIG. 2.

The threshold detector and inverter 29 provides an output signal or waveform D. Waveform D is positive going during all non-occurrences of a bipolar positional signal 49 in waveform B, and is a ground level signal or negative-going pulse during the time occurrence of a bipolar positional signal 49 in the integrated waveform B.

The operation of flip-flop 5 is such that whenever a positive signal is present at the reset input terminal 41 of the flip-flop 5, the flip-flop 5 will remain in the reset condition or switch to the reset condition regardless of the nature of the signals connected to the set terminal 23 of the flip-flop 5. Accordingly, flip-flop 5 can only be placed in the set condition during the coincidence of a positive going pulse produced by differentiator 21, and a ground level or negative-going pulse in the output waveform D of threshold detector-inverter 29. When this condition occurs, the flip-flop 5 will provide an output pulse 50 as shown by waveform E, the leading edge of the output pulse 50 being indicative of a zero crossover occurrence of a bipolar positional signal 49 in the output waveform A of transducer 9.

The output pulses 50 of the output waveform E of flip-flop 5 are constant in amplitude, but will vary in width or time duration in accordance with the speed of rotation of the flywheel 11, or time duration of the bipolar positional signals 49 from transducer 9. This is indicated by arrow 54. In order to provide an output signal representative of the zero crossover occurrences of the bipolar positional signals 49, that is both constant in amplitude and width or time duration, output waveform E of flip-flop 5 is differentiated by differentiator 45 to provide input trigger pulses to the one-shot 7. The output waveform F of the one-shot 7 includes positive-going pulses having leading edges corresponding to the zero crossover occurrences of the bipolar sense signals 49. The pulses 53 of waveform F are constant in amplitude and width or time duration, regardless of the time duration or amplitude of the bipolar sense signals 49 of waveform A.

Differentiator 21 is included in the comparator network 1 to reduce the possibility of placing flip-flop 5 in a race of non-latched condition, by providing a short duration set signal to the flip-flop 5. (The flip-flop is not latched when the set and reset levels are both high.) This signal terminates prior to time the reset signal is applied to flip-flop 5, that is, prior to the time waveform D returns from its ground level to it high level (positive level 48).

Channel 3 tends to saturate in integrating the bipolar position signals 49 of waveform A. It remains saturated both prior to and after the zero crossover of the bipolar positional 49 and therefore is not an accurate signal indication of the zero crossover occurrence or center slot position.

The threshold level detector-inverter 29 of integrating channel 3 provides the position signal detector with noise immunity by ensuring that the reset signal to flip-flop 5 cannot go low in response to zero crossing noise signals.

As mentioned in the introductory portion of this application, in the use to which the present circuit may be put the bipolar signal amplitude at low engine speed may be from 100 – 150 millivolts and at high engine speed may be from 20 – 30 volts. The noise is always lower than the signal amplitude and at low engine speeds is less than 10 millivolts and at high engine speeds can be as high as 2.1 volts. The circuit of the present application easily is able to distinguish signal from noise in this kind of environment. The values of the integrating network 25 are so chosen that throughout the range just specified, the integrated bipolar signal will cause the operational amplifier 27 to saturate and the noise signals, when integrated, will be at a relatively low, relatively constant level. It should be kept in mind here that the 100 millivolts signal obtained at low engine speed is of relatively long duration (4 milliseconds) so that when integrated, it results in substantial signal at input terminal 31. The noise lies in a frequency spectrum near that of the signal and when the many noise zero crossing signals are integrated, they have been found, when passed through amplifier 27, to produce an output of relatively constant level as shown in waveform B of FIG. 2.

In a practical circuit such as shown in FIG. 1 employed for the purpose discussed, some of the circuit elements chosen were:

Integration Network 25:
 Resistor = 470 kilohms
 Capacitor = 0.01 microfarads ($\mu$ fd.)
Differentiator 21:
 Capacitor = 390 microfarads
 Resistor = 47 kilohms
Differentiator 45:

Capacitor = 100 microfarads
Resistor = 20 kilohms

Monostable multivibrator 7 produced a 50 microsecond output pulse.

What is claimed is:

1. A circuit for distinguishing between zero crossings of interest, which recur over a relatively wide frequency range, of an input signal whose amplitude is inversely related to its width, and which may vary in amplitude and width, which crossings occur when the signal level changes from a relatively high amplitude peak of one sense to a relatively high amplitude peak of opposite sense, and zero crossings not of interest which occur when the signal level changes from a relatively substantially lower amplitude peak of one sense to a relatively lower amplitude peak of the opposite sense, comprising, in combination:

means for directly integrating said input signal for producing an integrated wave having peaks of relatively high and constant amplitude at times corresponding to that at which the zero crossings of interest occur over substantially the entire frequency range within which said zero crossings of interest recur and which is of substantially lower amplitude at other times;

a threshold circuit receptive of said integrated wave for producing an output pulse in response only to each of said peaks of relatively high amplitude;

means responsive to said input signal for producing a signal indication each time a zero crossing of said first signal occurs; and means responsive to said signal indications and to said output pulses for producing an output signal only when a signal indication occurs concurrently with an output pulse.

2. A circuit as set forth in claim 1 wherein said means responsive to said input signal comprises a differentiator.

3. A circuit as set forth in claim 2, wherein said means responsive to said signal indications and said output pulses comprises a circuit responsive to said pulses which is maintained inactive except during the presence of a pulse and responsive to said signal indication during the presence of one of said pulses for producing an output signal.

4. A circuit as set forth in claim 3 wherein said circuit comprises a flip-flop connected to receive said pulses at its reset terminal and said signal indications at its set terminal.

5. In a system which includes a rotating element whose speed may vary over a given range and a fixed element, a magnetic transducer fixed to one of said elements and magnetic means on the other element in a position such that it passes immediately adjacent to and causes a bipolar signal having an amplitude inversely related to its width and which may vary in amplitude and width, to be produced by said transducer once each period of said rotating element, a circuit for sensing the zero crossing of said bipolar signal comprising, in combination:

integrating means receptive of said signal for directly integrating the same for producing an integrated signal comprising pulses of relatively constant amplitude concurrent with the zero crossings of said bipolar signal, over substantially the entire speed range of said rotating element;

a threshold circuit receptive of the integrated signal produced by said integrating means for passing only the peaks of the integrated signal, said peaks occurring at the zero crossings of said bipolar signals;

a pulse producing circuit receptive of the signal produced by said transducer for producing an output pulse in response to each zero crossing of said signal; and coincidence circuit means receptive of said output pulses and the output wave produced by said threshold circuit for producing an output signal only when a pulse occurs concurrently with a peak in said output wave.

6. In a system as set forth in claim 5, said pulse producing circuit comprising a wave shaping circuit for translating each zero crossover of said signal to a steep leading edge, and a differentiator for translating each such edge to a pulse.

7. In a system as set forth in claim 5, said coincidence circuit means comprising a circuit having an inhibit terminal to which said output wave is applied in a sense to inhibit said circuit except during said peaks, and a signal input terminal to which said pulses are applied.

8. In a system as set forth in claim 7, said coincidence circuit means comprising a flip-flop, said inhibit terminal comprising the reset terminal of said flip-flop, said inhibit terminal comprising the reset terminal of said flip-flop and said signal terminal comprising the set terminal of said flip-flop.

9. In a system as set forth in claim 7, further including means coupled to said coincidence circuit means for translating its output signal to a pulse of fixed width and amplitude.

10. In combination:

a source producing both information zero crossing signals whose amplitude is inversely related to their width, and both of which parameters vary in such manner that the product of these parameters remains relatively constant, and noise signals having zero crossings;

means for producing a reference signal in response to each zero crossing signal produced by said source;

means for directly integrating the signals produced by said source to provide pulse signals of relatively constant amplitude concurrent with the zero crossings of said information signals;

a threshold circuit receptive of said pulse signals for producing an output pulse in response to each pulse signal of greater than a given threshold level;

and means responsive to said output pulses and said reference signals for producing a pulse for each reference signal due to an information zero crossing signal and for discriminating against the reference signals derived from zero crossings due to noise.

11. The system of claim 10 wherein as said means for producing reference signals comprises:

a voltage comparator having a first input terminal coupled to said source and a second input terminal connected to ground, whereby the output signal of said comparator changes from one voltage level to another for every zero crossover of the output signal of said source.

* * * * *